United States Patent
Hidaka et al.

(10) Patent No.: US 7,485,575 B2
(45) Date of Patent: Feb. 3, 2009

(54) METHOD OF MANUFACTURING SEMICONDUCTOR DEVICE

(75) Inventors: Yoshiharu Hidaka, Takatsuki (JP); Etsuro Kishio, Kyoto (JP)

(73) Assignee: Panasonic Corporation, Osaka (JP)

( * ) Notice: Subject to any disclaimer, the term of this patent is extended or adjusted under 35 U.S.C. 154(b) by 359 days.

(21) Appl. No.: 11/053,838

(22) Filed: Feb. 10, 2005

(65) Prior Publication Data

US 2005/0191853 A1  Sep. 1, 2005

(30) Foreign Application Priority Data

Feb. 13, 2004  (JP) ............................ 2004-036691

(51) Int. Cl.
*H01L 21/44* (2006.01)
(52) U.S. Cl. ................ 438/660; 438/799; 257/E21.588; 257/E21.496
(58) Field of Classification Search ................. 438/799, 438/660; 257/E21.588, E21.496; 427/120, 427/98.3
See application file for complete search history.

(56) References Cited

U.S. PATENT DOCUMENTS

| | | | |
|---|---|---|---|
| 6,607,982 B1 * | 8/2003 | Powell et al. | 438/687 |
| 2005/0029109 A1 * | 2/2005 | Zhang et al. | 205/118 |
| 2006/0216930 A1 * | 9/2006 | Feng et al. | 438/637 |

FOREIGN PATENT DOCUMENTS

JP  11186261  7/1999

* cited by examiner

*Primary Examiner*—Caridad Everhart
(74) *Attorney, Agent, or Firm*—Dickinson Wright, PLLC

(57) ABSTRACT

A semiconductor substrate is inserted into a heat treatment apparatus at a low temperature ranging from room temperature to about 50° C., and organic substances included in a metal on the semiconductor substrate are released without carbonization in an annealing process before CMP. Further, organic substances capable of preventing the corrosion of the metal are decomposed, and the organic substances themselves and chlorine, sulfuric acid, and ammonia which are included in the organic substances are diffused out of the metal film by setting the heat treatment apparatus at a rate of temperature rise of 15° C./min or less until a prescribed heat treatment temperature is reached.

7 Claims, 6 Drawing Sheets

TDS analysis data of the BTA and the BTA-Cu complex at the rate of temperature rise of 50°C/min TDS analysis data of the BTA and the BTA-Cu complex at the rate of temperature rise of 20°C/min TDS analysis data of the BTA and the BTA-Cu complex at the rate of temperature rise of 10°C/min.

METHOD OF MANUFACTURING SEMICONDUCTOR DEVICE

BACKGROUND OF THE INVENTION

1. Field of the Invention

The present invention relates to a method of manufacturing a semiconductor device. More particularly, it relates to a method of manufacturing a semiconductor device by which impurities, such as organic substances, included in a metal wiring material can be removed.

2. Description of the Related Art

With the recent rapid progress of finer patterning techniques, copper (Cu) wiring having a lower resistance has been used as a wiring material between transistors in the manufacture of semiconductor devices. However, copper presents difficulties in its film formation and line-shaped etching including rapid corrosion development, so that the Cu wiring is formed by using a damascene method. The damascene method comprises forming an interlayer insulating film on transistors and a lower metal wiring, forming via holes and a wiring trench, which are used for connections to the transistors and the lower metal wiring, in the interlayer insulating film, and burying Cu in the via holes and the wiring trench.

According to the damascene method, recesses, such as a wiring trench and via holes, are formed in an insulating film on a wafer, Cu is deposited thick on the entire surface of the wafer by electroplating or electroless plating, and the Cu is removed except that in the recesses by chemical-mechanical polishing (CMP) to form a wiring layer.

At present, a dual damascene method has become mainstream in terms of not only finer patterning of the wafer but its cost reduction. The dual damascene method comprises successively forming via holes and a wiring trench, which are used for connections to a lower wiring, in an interlayer insulating film, and forming a wiring to be connected to the lower wiring by Cu burying limited to one occasion and CMP.

As to plating utilized for the Cu burying, the thickness of the growing Cu varies greatly depending on the number of the via holes and the size of the wiring trench. As a result, the planarity of their surface may be significantly impaired after CMP.

In order to cope with the significant variation in the Cu growth rate caused by its burying pattern, plating solutions contain organic additives called a leveler and an accelerator in addition to copper sulfate. Also, the plating solutions contain another additive which retards the corrosion development of the plated portions in the atmosphere and during storage of wafers using storage cases. In addition, it is thinkable that the plating solutions contain an additive solution which controls their pH.

In general, the additives in the plating solutions have been regarded as a piece of know-how by plating solution makers. Therefore, semiconductor makers using those solutions have not been given the details of the plating solutions.

As to the leveler or the accelerator in the plated film, some are able to become encroached in the via holes and the trench, but some are not. It is said that the growth rate of the plated film varies by the presence or absence of those additives.

In addition, the following is also thinkable: an organic substance with a relatively high molecular weight which cannot become encroached in the trench as the leveller or the accelerator and an organic substance with a relatively low molecular weight which can uniformly exist everywhere including the trench are selected, and the balance of the two organic substances is adjusted. By doing this, the leveller or the accelerator controls the growth rate of the plated film during plating. As a result, the plated film is controlled so as to have no trench pattern dependency and to be able to be formed in a flatter state.

By adding these additives to the plating solution, the pH of the plating solution varies greatly, so that it is thinkable that the growth rate of the plated film varies greatly and that the additives are organic substances containing an amine group.

As an inhibitor used for Cu, BTA(benzotriazole) is most famous, and hence there may be cases where BTA is added in order to simply enhance the corrosion resistance of plated films. Besides, there are many cases where the corrosion prevention effect is imparted to chelating agents. Those chelating agents may contain an amine group, sulfur, and phosphorus.

A plated film formed by using a plating solution containing those additives is deposited in a state that it contains the various additives. Therefore, the plated film containing these additives is of high resistance, so that the decomposition and the release of the additives are conducted through heat treatment which is carried out at a subsequent manufacturing step. As a result, the additives are partly left in the Cu film as bubbles, which causes the degradation of electro-migration resistance and stress-migration resistance.

As a method of removing the bubbles which degrades the electro-migration resistance, a method of conducting heat treatment after CMP has been already proposed (see, for example, Japanese Patent Laid-Open No. 186261/1999).

In this heat treatment method, wafers are inserted into a heat treatment apparatus at a temperature of 300° C. or less after CMP, and then the temperature is raised to a prescribed heat treatment temperature of 300° C. to 500° C. at a rate of temperature rise of 20° C./min or less. Their heat treatment time at the highest temperature is from 5 seconds to 2000 seconds.

As described above, the removal of the impurities from the plated film through heat treatment after CMP simply makes the grain size of the Cu increase. Therefore, the electro-migration resistance is improved, but voids are exposed in the upper portion of the metallic material, which impairs its planarity.

Besides, in case where the wafer is heat treated at a temperature of 300° C. or more, hillocks are generated due to the existence of crystal grains which causes the abnormal growth of the Cu crystals. Therefore, in order to prevent the hillocks and the voids in the Cu film, heat treatment conditions before CMP are of consequence.

Further, in case where the technique proposed is applied to heat treatment before CMP, it is assumed that the wafer is inserted into the heat treatment apparatus at a temperature of about 150° C. Since the plating solution contains the organic additives, their carbonization proceeds before decomposition at a temperature in excess of 100° C. As a consequence, the grain growth of the Cu is promoted, but the voids tend to increase.

In addition, when the heat treatment temperature is in excess of 300° C., the hillocks on the surface of the Cu film increase markedly in size and have a height of 3 μm maximum. As a result, the asperities on the surface markedly increase in scale before CMP. After CMP, wave-shaped asperities on the wafer surface, such as dishing and erosion, and pattern density-dependent unevenness increase in scale.

Metal wiring used for a present-day fine patterning process has been mainly made of copper material so as to be of low resistance.

In case where copper material is used to form metal wiring, the following method is used: via holes and a wiring trench are formed in an interlayer insulating film, and then, subsequently, a Cu film is formed in such a manner that the Cu wiring material is buried in the via holes and the wiring trench by plating or the like. After that, the Cu film is planed off by CMP so as to become flush with the surface of interlayer insulating film.

The plated film contains the large amount of organic substances and ingredients of solutions (additives) added to the plating solution. Therefore, those additives are left in the wiring material, which causes a problem that wiring resistance becomes too high to achieve a prescribed resistance.

Besides, since the organic substances left in the wiring inhibit the grain growth of the wiring material, they cause the degradation of electro-migration resistance.

Furthermore, sulfate group, an amine group, and chlorine group added to the plating solution cause the following problem when left in the film: the sulfate group, amine group, and chlorine group may exist when the interlayer insulating film and the metal film are grown after plating and in a state that they are deposited at a set temperature during dry etching. In this case, the sulfate group, amine group, and chlorine group corrode the Cu during chemical liquid process and water washing process conducted to remove reaction products (polymers) generated when the wiring trench and the via holes have been formed.

Likewise, there is a high possibility that the organic substances added to the plating solution contain substances having Cu-dissolving ingredients, such as amine group. Therefore, an amine group or the like may also exist solely in these substances when the interlayer insulating film and the metal film are grown and when decomposed at a set temperature during dry etching. In this case, the Cu is corroded during chemical liquid process and water washing process in the process of removing polymers after the formation of the wiring trench and the via holes.

Also, there is caused a phenomenon in which the interface between the Cu film and the interlayer insulating film is abnormally etched after the polymer removal.

Further, it is expected that the organic substances existing in the Cu wiring material are decomposed by not only heat generated by operating the semiconductor device after its completion but heat emitted by driving systems, such as motors, around the semiconductor device. This generates voids in the wiring material and makes portions where the upper and lower layers are connected to each other at the contact regions and the like highly resistant. Therefore, the semiconductor device malfunctions due to wiring delay, and that there is a high possibility that its mounted portions corrode due to moisture permeating from the wiring.

Furthermore, in case where the Cu wiring layer is formed, it is necessary to prevent short circuits between the upper and lower wirings by preventing the abnormal growth of the metal grains, i.e., the hillocks.

As explained above, in the related art manufacturing method of semiconductor devices, metal wiring is formed by burying in the buried metal wiring process. At this time, organic substances and ionic impurities are included in a metal of which the wiring is made up. As a result, there have been cases where wiring resistance is increased, electro-migration resistance and stress-migration resistance are degraded due to the inhibition of its grain growth by heat treatment, the metal film is corroded, and abnormal etching occurs at the interface between the metallic material and the interlayer insulating film, which has frequently impaired the reliability of the metal film wiring.

SUMMARY OF THE INVENTION

It is an object of the invention to provide a method of manufacturing a semiconductor device by which the reliability of a wiring of a metal film can be improved.

In order to solve the problem, the method of manufacturing a semiconductor device of the invention comprises the steps of forming recesses in an insulating film on a semiconductor substrate, burying a metal film in the recesses through plating using a plating solution containing additives, removing the additives included in the metal film through the heat treatment of the metal film, and leaving the metal film only in the recesses by planing the metal film. The heat treatment is conducted by inserting the semiconductor substrate into a heat treatment apparatus at a inserting temperature ranging from room temperature to room temperature plus 30° C. and then raising the temperature to a prescribed heat treatment temperature.

According to the invention, the large amount of organic substances included in the metal film are decomposed and diffused out of the metal film without carbonization, so that the reliability of the wiring of the metal film can be improved.

In the method of manufacturing the semiconductor device, it is preferable that the inserting temperature be from 20° C. to 50° C. and the heat treatment temperature be from 100° C. to 300° C.

By utilizing such temperature settings, the large amount of organic substances included in the metal film can be diffused out of the metal film. Also, the hillocks of the copper (Cu) can be prevented, and the development of voids can be prevented. As a result, the reliability of the wiring of the metal film can be improved.

Further, in the method of manufacturing the semiconductor device, it is preferable that the rate of temperature rise from the inserting temperature to the heat treatment temperature be less than 20° C./min and, more specifically, 15° C./min or less.

By utilizing the setting, the organic substances capable of preventing the corrosion of the metal are decomposed, so that the organic substances themselves and chlorine, sulfuric acid, and ammonia included in the organic substances can be diffused out of the metal film. In consequence, the reliability of the wiring can be increased further.

Further, in the method of manufacturing the semiconductor device, it is preferable that the retention time after the temperature rise be from 30 minutes to 120 minutes.

This set time is required to remove the organic substances out of the metal film after their decomposition.

Still further, in the method of manufacturing the semiconductor device, it is preferable that the heat treatment be conducted in an atmosphere of inert gas or reducing gas.

At present, the subject film formed by plating is made of a metal, such as Cu, having a tendency to be corroded and oxidized, so that inert gas or reducing gas is necessary. Also, it is considered that reducing gas is effective in order to promote the decomposition of the organic substances included in the metal film.

In this way, the inserting temperature and the rate of temperature rise are lowered in the annealing process wherein the Cu wiring of the semiconductor device is formed.

As described above, according to the method of manufacturing the semiconductor device of the invention, the large amount of organic substances included during plating are diffused out of the metal wiring by choosing the inserting temperature between, for example, room temperature (20° C.) and 50° C. and the heat treatment temperature between, for example, 100° C. and 300° C. When the stress-migration resistance and the electro-migration resistance of the Cu wiring have been evaluated through the use of a contact chain, it has been found that the semiconductor substrate lasts about 10 times longer than related art semiconductor substrates, and its reliability has been able to be improved.

Also, the large amount of organic substances included during plating which are capable of preventing the corrosion of the Cu and of controlling the growth rate of the Cu are decomposed by the heat and diffused out of the Cu film. At the same time, organic substances having chlorine group, sulfate group, and ammonia group which are capable of controlling the pH of the plating solution are decomposed, and the organic substances can be removed from the Cu film in the form of chlorine, sulfuric acid, and ammonia. As a result, side etch at the interface of the Cu film and the SiOC film generated during the polymer removing process can be prevented, so that the reliability of the wiring have been further improved by an order of magnitude.

At present, the subject film formed by plating is made of a metal, such as Cu, having a tendency to be corroded and oxidized, so that inert gas or reducing gas is necessary. Also, it is considered that reducing gas is effective in order to promote the decomposition of the organic material included in the metal film.

DESCRIPTION OF THE PREFERRED EMBODIMENTS

To begin with, a method of forming an buried Cu wiring to which the invention is applied, that is, a method of manufacturing a semiconductor device will be described.

With the recent rapid progress of patterning methods of semiconductor devices, conversion to Cu has been made as their wiring material. In combination with the conversion, a method of manufacturing a semiconductor device is employed which comprises forming recesses such as a wiring trench and via holes, burying the Cu material in the recesses, and planing the unnecessary portions of the Cu by CMP to planarize the surface of the substrate and to give independence to the wiring.

Figure 2A:
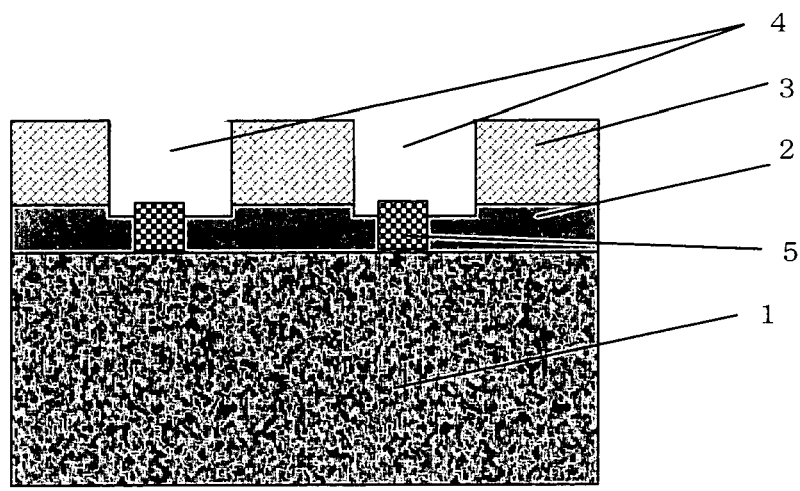
FIGS. 2A, 2B, and 2C are sectional views showing a manufacturing flow of a semiconductor device by process.
Figure 2B:
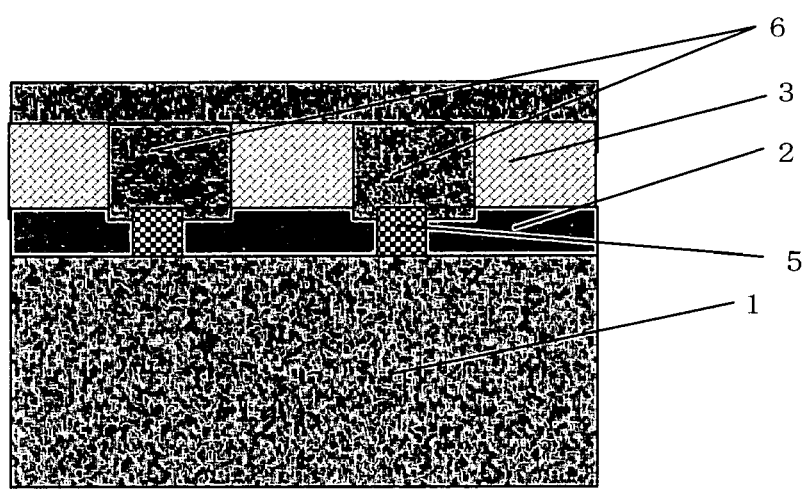
Figure 2C:
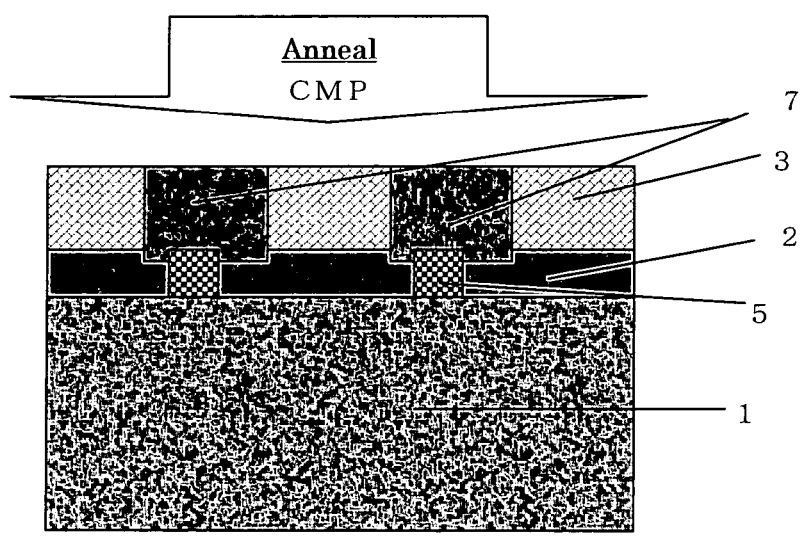

FIGS. 2A, 2B, and 2C illustrates a flow of the formation of the buried Cu wiring. In the method of forming the buried Cu wiring, transistors (not shown) are formed on a semiconductor substrate 1, and then, subsequently, a SiO$_2$ film is grown by plasma CVD as an interlayer insulating film 2 on the transistors as shown in FIG. 2A. Then via holes used for connecting the transistors to one another are formed in the interlayer insulating film 2 on the transistors, and an buried W film is formed in the via hole. Thereafter, an interlayer insulating film 3 used for a first metal wiring is formed for the purpose of forming a first-layer metal wiring. A low-dielectric constant (Low-k) film, e.g., a SiO$_2$ film is formed this time by CVD in order to reduce wiring capacity. Then a resist is applied to the SiOC film, the resist is patterned, and thereafter a first metal wiring trench 4 are formed by dry etching.

Furthermore, as shown in FIG. 2B, a Ta or TaN film serving as an electrode during electroplating is formed on the entire surface of the semiconductor substrate including the first metal wiring trench 4 by sputtering, and then a Cu film is grown on the entire surface as an buried metal film 6 by electroplating.

After this, the plated film is annealed in order to smoothly conduct CMP. At this time, the method of manufacturing a semiconductor device of the invention is employed.

Then, as shown in FIG. 2C, the plated Cu film is polished by CMP using a slurry (abrasive) made by mixing an ingredient which oxidizes the Cu and an ingredient which prevents the oxidation of the Cu. As a consequence, unnecessary portions of the Cu deposited on the SiOC film are removed, and the necessary Cu is left only in the trench to give a first metal wiring 7.

Embodiment 1

Figure 1:
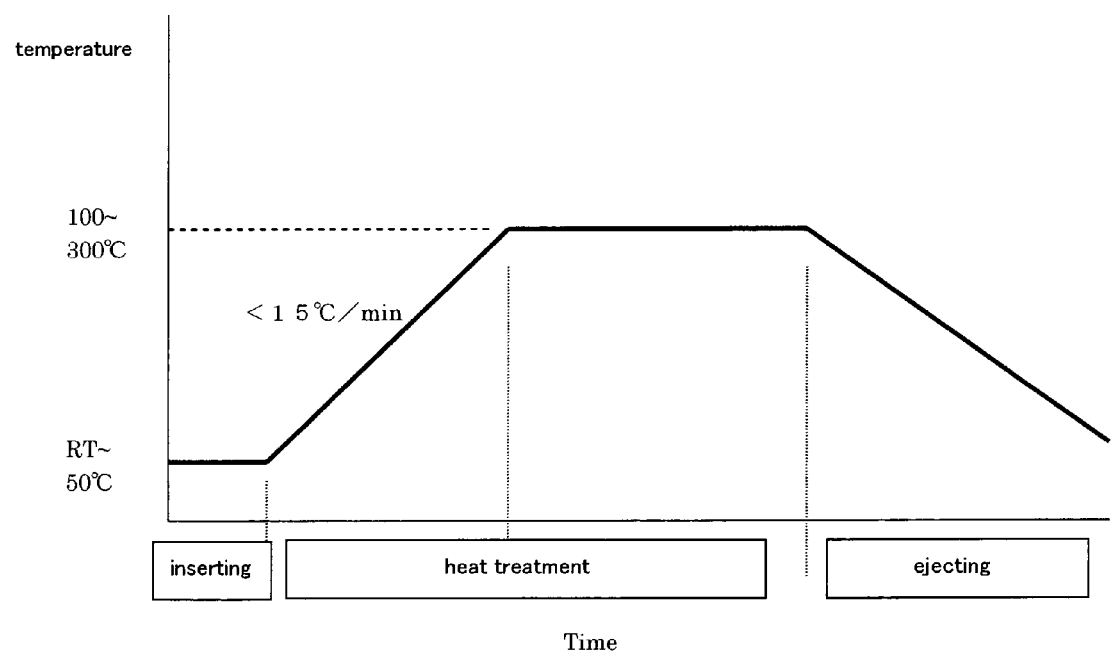
FIG. 1 is a conceptual graph of an anneal flow of an buried metal film according to an embodiment of the present invention.

Inserting Temperature and Heat Treatment Temperature; FIG. 1

Embodiment 1 of the invention will be described with the reference to the drawing. FIG. 1 illustrates a process sequence according to Embodiment 1 of the invention.

The metal film formed by plating contains a large amount organic substances in order to prevent the corrosion of the Cu and control the growth rate of the Cu. When the semiconductor substrate is inserted into an atmosphere at a temperature in excess of 100° C., some of the organic substances become carbonized gradually, which inhibits the grain growth of the Cu.

In the embodiments of the invention, as shown in FIG. 1, there is adopted a process sequence which comprises inserting a semiconductor substrate into a heat treatment apparatus at a low temperature ranging from room temperature (RT: about 20° C.) to 50° C., raising the temperature to a heat treatment temperature of 100° C. to 300° C. at a rate of, for example, 15° C./min, maintaining the temperature for about 60 minutes, and ejecting the semiconductor substrate upon temperature drop operation. In a batch-type vertical annealing furnace, the loss of the closing time of each lot can be reduced by ejecting the semiconductor substrates upon the temperature drop operation.

It is preferable that the retention time after the temperature rise be between 30 minutes and 120 minutes. Also, it is preferable that the heat treatment be conducted in an atmosphere of inert gas or reducing gas. Since the subject film formed by plating is a metal having a tendency to be corroded and oxidized, such as Cu, inert gas or reducing gas is required. Also, it is considered that reducing gas is effective in order to promote the decomposition of the organic materials included in the metal film.

The heat treatment temperature after the temperature rise becomes about 300° C. at the maximum in order to prevent Cu hillocks and prevent the development of voids.

Figure 3:
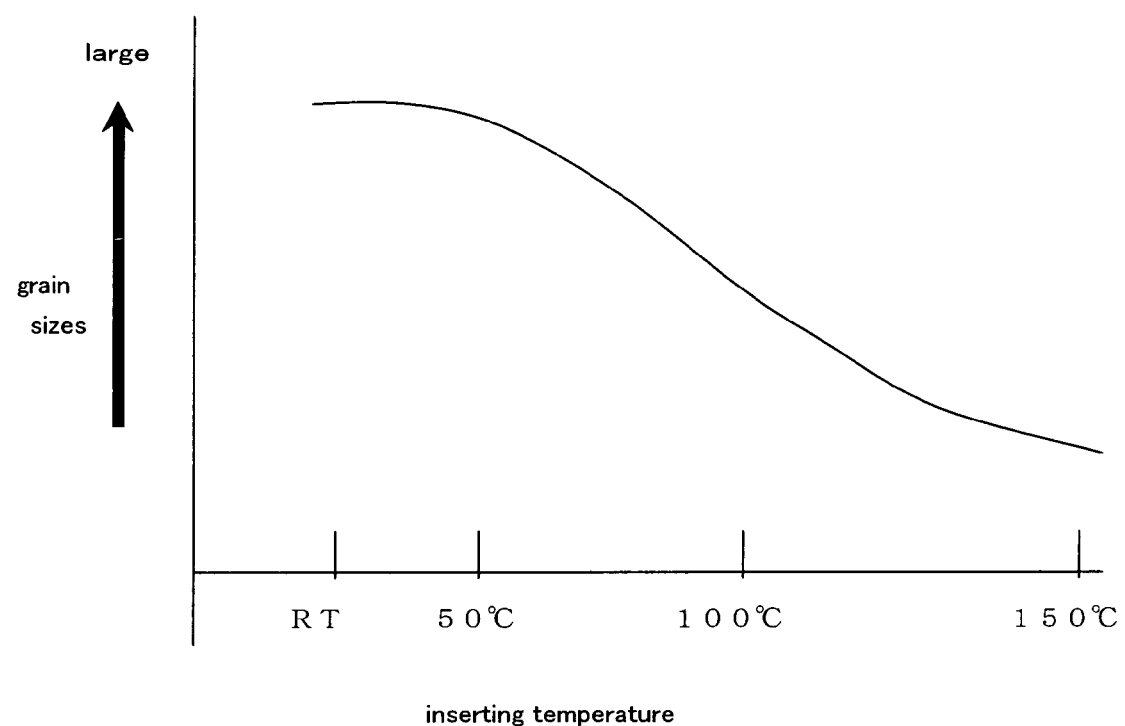
FIG. 3 is a graph showing the relationship between inserting temperatures and Cu grain sizes.

FIG. 3 shows a relationship between the inserting temperature of the semiconductor substrate and the grain size of the Cu. It has been found that the inserting at a temperature of 50° C. or less makes the grain size larger as compared to the inserting at a temperature in excess of 50° C.

AS a result, it is assumed that the out diffusion of the organic substances included in the plated film occurs due to the low-temperature inserting and the subsequent temperature rise.

When the stress-migration resistance and electro-migration resistance of the Cu wiring formed by using this method has been evaluated through the use of a contact chain, it has been found that the semiconductor substrate lasts about 10 times longer than related art semiconductor substrates.

Embodiment 2

Rate of Temperature Rise; FIG. 1

Embodiment 2 of the invention will be described with reference to the drawings.

The metal film formed by plating contains a large quantity of organic substances which prevent the corrosion of the Cu and control the growth rate of the Cu. Further, it contains some substances containing chlorine group, sulfate group, and ammonia group which control the pH of the plating solution, etc.

When the semiconductor substrate is inserted into an atmosphere at a temperature in excess of 100° C., some of the organic substances become carbonized gradually, which inhibits the grain growth of the Cu.

Further, chlorine group, sulfate group, ammonia group and so on, which control the pH of the plating solution, etc., are included in the plating solution solely and may be included in the organic substances.

In addition, there are many cases where BTA (benzotriazole) are included as an inhibitor for the Cu. These inhibitors are included in a state that they are deposited solely, and, at the same time, they form a complex with the Cu respectively, which constitutes an obstacle to its wiring resistance reduction. Therefore, it is necessary to decompose these organic substances by the heat and, at the same time, remove them from the Cu film by out diffusion.

The invention provides a process sequence shown in FIG. 1 which comprises inserting the semiconductor substrate into a heat treatment apparatus at a low temperature ranging from room temperature (RT: about 20° C.) to 50° C., raising the temperature to a prescribed heat treatment temperature of 100° C. to 300° C. at the rate of the temperature rise of 15° C./min, maintaining the prescribed temperature for about 60 minutes, and ejecting the semiconductor substrate upon temperature drop operation. It is preferable that the retention time after the temperature rise be between 30 minutes and 120 minutes. Also, it is preferable that the heat treatment be conducted in an atmosphere of inert gas or reducing gas.

The heat treatment temperature after the temperature rise becomes about 300° C. at the maximum in order to prevent Cu hillocks and prevent the development of voids.

Figure 4A:
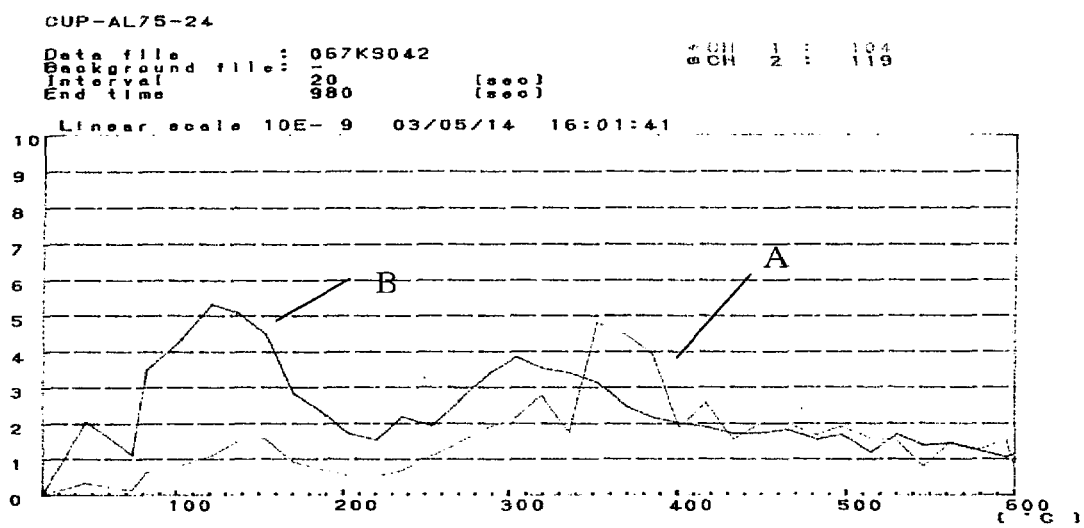
FIG. 4A is a graph showing TDS analysis data of inhibitors detected after their sublimation from a Cu film on condition that their rate of temperature rise is 50° C./min.
Figure 4B:
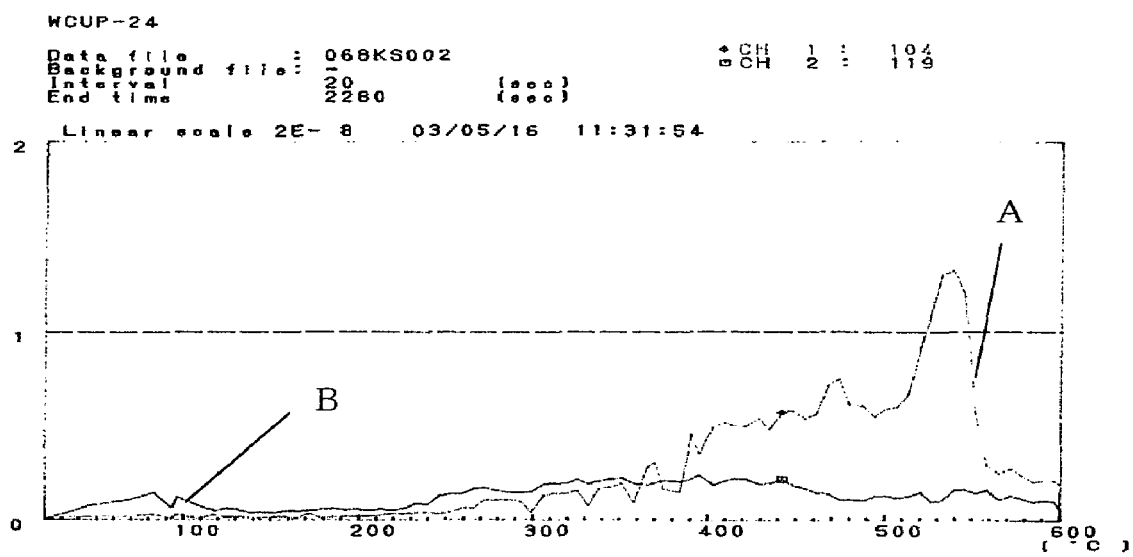
FIG. 4B is a graph showing TDS analysis data of inhibitors detected after their sublimation from a Cu film on condition that their rate of temperature rise is 20° C./min.
Figure 4C:
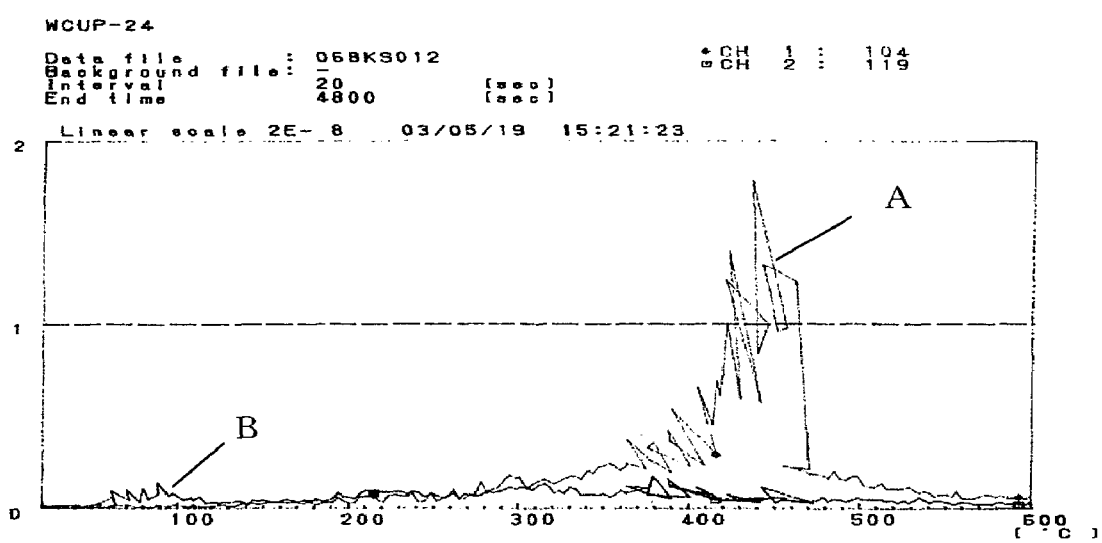
FIG. 4C is a graph showing TDS analysis data of inhibitors detected after their sublimation from a Cu film on condition that their rate of temperature rise is 10° C./min.

FIGS. 4A, 4B, and 4C shows the detected amounts of BTA and a BTA-Cu complex obtained by means of a thermal desorption (TDS) method (temperature rise-type gas chromatograph) using variations in rate of temperature rise. Three rates of temperature rise of 50° C./min, 20° C./min, and 10° C./min were chosen to detect the peak amounts of the BTA and the BTA-Cu complex. FIG. 4A shows TDS analysis data of the BTA and the BTA-Cu complex at the rate of temperature rise of 50° C./min, FIG. 4B shows TDS analysis data of the BTA and the BTA-Cu complex at the rate of temperature rise of 20° C./min, and FIG. 4C shows TDS analysis data of the BTA and the BTA-Cu complex at the rate of temperature rise of 10° C./min. In FIGS. 4A, 4B, and 4C, curves B denote the analysis data of the BTA, and curves A denote the analysis data of the BTA-Cu complex.

As is found from FIGS. 4A, 4B, and 4C, their sublimation did not occur in a specific temperature range at the rate of temperature rise of less than 20° C./min. However, their base-level detected amounts were not found at the rate of temperature rise of 50° C./min. Although shifting to a higher-temperature range, their peak amounts were detected at the rate of temperature rise of 20° C./min, and their sublimation occurred in a specific temperature range.

Also, the total detected amounts of the BTA and the BTA-Cu complex became large at the rate of temperature rise of 20° C./min. Further, when the rate of temperature rise was lowered to 10° C./min, there was a temperature range wherein the BTA and the BTA-Cu complex are detected in large amounts. It was found that the BTA is detected in the vicinity of 120° C. and the BTA-Cu complex is detected in a large amount in the vicinity of 420° C. In order to diffuse the inhibitors, such as the BTA, out of the metal film, it is necessary to set a rate of temperature rise at which their decomposition is promoted.

As to the decomposition of the BTA and the BTA-Cu complex, it is considered that the rate of temperature rise is most important. The highest heat treatment temperature of the semiconductor substrate is of the order of 350° C. to 420° C. in view of the film-forming temperature of the interlayer insulating film other than the plated film. Further, the BTA and so on decompose during the formation of the interlayer insulating film other than the plated film. Still further, increased annealing temperature is excluded from the setting in view of other troubles such as void growth.

It is preferable that the rate of temperature rise be less than 20° C./min and, more specifically, 15° C./min or less. The reason behind this is that the rate of temperature rise of 20° C./min is judged to be ineffective in terms of their decomposition since their sublimation temperature is shifted to the higher temperature range.

Further the organic substances having chlorine group, sulfate group, and ammonia group in the plated Cu film are decomposed at this stage and are removed from the film in the form of chlorine, sulfuric acid, and ammonia.

These solvents have a strong possibility that they are decomposed by temperature history during the formation of insulting film and metal film in a subsequent process and by heat generated during the operation of a system provided with the semiconductor device having the semiconductor substrate, so that side etch occurs at the interface of the Cu film and the SiOC film in the polymer-removing process after the formation of the via holes and the wiring trench conducted for the formation of the upper layer wiring, which has impaired the reliability of the wiring.

The side etch at the interface of the Cu film and the SiOC film which has been generated in the polymer removing process have been prevented by choosing the rate of temperature rise, so that the reliability of the wiring has been further improved by an order of magnitude. The reason why the side etch have been prevented is that it is assumed that the out diffusion of the organic substances included in the plated film occurs due to the low-temperature inserting and the subsequent heating of the semiconductor substrate.

INDUSTRIAL APPLICABILITY

As described above, the method of manufacturing a semiconductor device of the invention is useful because it can be applied to methods of removing impurities included in wiring material of semiconductor devices.

What is claimed is:

1. A method of manufacturing a semiconductor device, comprising the steps of:

forming recesses in an insulating film on a semiconductor substrate;

burying a metal film in the recesses by plating using a plating solution containing additives;

removing the additives included in the metal film by heat treating the metal film; and removing the metal film adhering to the insulation film to leave the metal film only in the recesses, wherein;

the heat treatment is conducted by inserting the semiconductor substrate into a heat treatment apparatus at an introducing temperature of 20° C. to 50° C., heating the semiconductor substrate to a desired heat-treating temperature, and holding the semiconductor subtrate at the desired heat-treating temperature for 30 to 120 minutes.

2. The method for manufacturing a semiconductor device according to claim 1, wherein the metal film is a copper film and the desired heat-treating temperature is from 100° C. to 300° C.

3. The method for manufacturing a semiconductor device according to claim 1, wherein the heat treatment is conducted in an atmosphere of inert gas or reducing gas.

4. The method for manufacturing a semiconductor device according to claim 1, wherein a rate of temperature rise from the inserting temperature to the prescribed heat treatment temperature is less than 20° C./min.

5. The method for manufacturing a semiconductor device according to claim 4, wherein the metal film is a copper film and the desired heat-treating temperature is from 100° C. to 300° C.

6. The method for manufacturing a semiconductor device according to claim 1, wherein a rate of temperature rise from the inserting temperature to the prescribed heat treatment temperature is 15° C./min or less.

7. The method for manufacturing a semiconductor device according to claim 6, wherein the metal film is a copper film and the desired heat-treating temperature is from 100° C. to 300° C.

* * * * *